United States Patent [19]

Lanquist et al.

[11] Patent Number: 4,750,552
[45] Date of Patent: Jun. 14, 1988

[54] ARRANGEMENT IN A UNIT HAVING A HEAT-EXCHANGE FUNCTION

[75] Inventors: Roland E. R. Lanquist, Ösmo; Bengt H. Hillerbrant, Rönninge, both of Sweden

[73] Assignee: Fläkt AB, Nacka, Sweden

[21] Appl. No.: 905,462

[22] Filed: Sep. 10, 1986

[30] Foreign Application Priority Data

Sep. 10, 1985 [SE] Sweden .................................. 8504185

[51] Int. Cl.⁴ ......................... H01L 23/46; F24F 3/04
[52] U.S. Cl. ........................... 165/104.33; 165/104.34; 165/123; 361/384
[58] Field of Search .............. 165/123, 104.33, 104.34; 361/384

[56] References Cited

U.S. PATENT DOCUMENTS 1,462,321  7/1923  Burnham ............................ 165/908
2,848,199  8/1958  Drewes, Jr. ......................... 165/123

FOREIGN PATENT DOCUMENTS 493768  6/1950  Belgium ............................. 165/123

Primary Examiner—Albert W. Davis, Jr.
Attorney, Agent, or Firm—Burns, Doane, Swecker & Mathis

[57] ABSTRACT

An arrangement in a heat-exchange unit comprising heat-emitting or heat-absorbing means which are exposable to an incoming medium flow entering the unit and which are effective to change the energy content of incoming medium flow to form an exiting medium flow which leaves the unit. A further medium flow is delivered to the incoming medium flow in the vicinity of the unit, this further medium flow being so directed as to force the incoming medium flow through the unit with the aid of an ejector effect.

31 Claims, 1 Drawing Sheet

ABILITY IN A UNIT HAVING A
HEAT-EXCHANGE FUNCTION

TECHNICAL FIELD

The present invention relates to an arrangement in a unit having a heat-exchange function and comprising heat-emitting and heat-absorbing means which are exposable to an incoming flow of medium entering the unit. These means change the energy of the incoming medium flow, and the resultant flow is hereinafter referred to as "a medium flow exiting from the unit".

The arrangement according to the present invention can be used in conjunction with a gaseous or liquid medium. For the sake of simplicity, however, the invention will be described later with reference to an air-circulation, cooling system having a cooling element which is positioned above and/or beneath an array of electronic equipment which generates heat when working.

Background Prior Art

Cooling systems which function with gravitational convection in accordance with the above principles and cooling elements of the aforesaid kind are known to the art.

For example, it is known to cool arrays of electronic equipment, such as telephone equipment, arrays in rows, side-by-side, with the aid of a cooling system which cools the flow of air heated by the equipment in operation and which includes a cooling element or cooling unit arranged above passageways located between mutually adjacent rows of equipment.

The purpose of such a system is to create gravitational convection conditions with the aid of hot air flows, such that an air flow heated by an array, or arrays, of electronic equipment when in operation is able to rise and enter the cooling element, to be cooled therein, this somewhat cool airflow exiting from the cooling element and sinking down gravitationally towards the floor supporting the equipment and passing from said floor into the array of equipment, where it again takes-up heat, to form an upwardly rising heated air flow.

One such known system is retailed under the tradename "ERICOOL" through RIFA AB, Stockholm, Sweden.

Other systems for cooling arrays of electronic equipment are also known to the art.

For example, systems are known in which cooling elements are placed immediately above an array of electronic equipment.

Systems are also known in which one or more cooling elements are placed in the proximity of one or more groups of components, where a number of such groups forms the aforesaid array. In this way there is obtained in the immediate vicinity of the heat-generating components a cooling effect which can be regulated in response to the amount of heat generated.

In addition hereto, there are known to the art, office ventilating systems, referred to as "induction systems", which include blower nozzles so arranged as to entrain air from the room to be ventilated by co-ejection, thereby to ensure good admixture of the circulating room air with ventilation air delivered to the system, or system apparatus, from a central air processing unit through a system of conduits, the ventilation air preferably being brought to a temperature of $+10°$ C.$-+15°$ C. in said unit.

SUMMARY OF THE PRESENT INVENTION

With regard to the present state of the art as expressed above it will be seen that one related technical problem resides in the provision of an arrangement in a unit which is adapted for heat-exchange purposes and incorporates heat-emitting or heat-absorbing means exposable to an incoming flow of medium entering the unit, and in which unit the aforesaid means change the energy content of the incoming flow of medium to form an exiting medium flow which leaves the unit, and to provide in conjunction therewith conditions for generating a further flow of medium which can be readily delivered to the incoming medium flow entering the unit, so as to ensure thereby that no additional space is required around the unit for generating forced flow conditions.

Another technical problem encountered in an arrangement of the aforesaid kind is one of creating simple conditions which will enable said further medium flow to be so directed that it is able to force the incoming medium flow through the unit with the aid of a co-ejector effect, so as to create thereby air circulation without requiring therefor the use of large fan assemblies for forcing and directing the incoming medium flow through the unit.

A further technical problem is one of creating in an arrangement of the aforesaid kind, while observing the aforementioned technical evaluations, conditions which will extend the stay-time of the incoming medium flow and preferably also lengthen the path of travel of the medium along cooling fins provided in the unit, so as to create conditions for more effective emission or absorption of thermal energy during the time the medium flows through the unit.

Another technical problem is one of providing conditions in an arrangement of this kind which enable the exiting medium flow to leave the unit in a direction which conforms substantially to the direction of the incoming medium flow, despite the fact that the medium flow is deflected from said direction during its stay-time in the unit.

Still another technical problem resides in the provision of conditions which will enable the exiting flow of medium to be controlled or guided as a whole, or to be divided into part flows capable of being directed towards two arrays of electronic equipment, each located on a respective side of the unit.

In those embodiments where the further medium flow or further medium flows is (are) delivered through delivery pipes perforated with holes, a further problem resides in adapting the cross-sectional area of the hole and/or its location correctly with regard to the aforesaid conditions provided for solving the abovementioned technical problems.

It has been established that the aforesaid hole, or holes, should be very fine and that consequently there is a risk of the holes becoming blocked with foreign particulate substances during operation. Consequently, a prime problem exists in the ability to use finely perforated pipes while, at the same time, providing conditions which will ensure that the sum of the mass weight of respective medium flows per unit of time multiplied by their velocity will present a value, calculated per square meter of cross-sectional area at right angles to the direction of the air flow, which lies within a given limit range relevant to an effective transfer of heat between said-emitting or heat-absorbing means and the incoming air flow.

In the case of present-day cooling systems which operate with circulating air and which comprise a cooling element or cooling unit intended for cooling an array of electronic equipment, and placed above and/or beneath the array, such that, for example, a flow of air cooled by the cooling element or unit is able to sink down towards (against) or around the array of equipment, preferably between two such arrays, while a flow of air heated by the equipment is able to rise upwards towards the cooling element, it is a recognized fact that the cooling effect afforded by these systems is not sufficient to meet prevailing needs, and hence a qualified technical problem resides in the provision of conditions for improving the cooling efficiency of such systems with the aid of simple means located within the external defining surfaces of the cooling unit or element.

Another technical problem associated with known cooling systems of the aforesaid kind resides in the difficulty in providing conditions which will ensure that the somewhat cooled air flow is actually guided into and passes through the array of electronic equipment in a manner to cool effectively the heat-generating components thereof, since natural convection has not been found sufficiently effective to provide the degree of cooling required; the use of powerful fans for this purpose is both expensive and space consuming. Consequently, a further qualified technical problem resides in the provision of simple means which will forcibly control or guide both the cooled and the heated air flows in a manner which will enable greater quantities of cooled flowing air to be used to cool the electronic components.

Another technical problem is one of creating conditions which will enable existing known air-cooling systems to be modified with simple means which require no external space, without requiring further work on the system, and where additional measures can be concentrated solely on the cooling element.

Still another technical problem resides in creating, with the aid of simple means, conditions which will enable the cooling ability of a cooling system to be adapted effectively to prevailing loads on the electronic components of the array, or arrays, of equipment when in operation, and to fluctuations in the heat generated by the components.

A further technical problem is one of providing conditions which will enable each electrical component of the electrical equipment to operate in an environment of relatively low ambient temperature, so as to create thereby conditions which will increase the operational durability of the equipment and its components and to reduce the influence of such factors as those liable to increase the frequency at which faults may occur.

A further technical problem is one of creating conditions which will enable a cooling element constructed in accordance with the invention to be adapted readily for manufacture with the use of known cooling element manufacturing methods.

Another technical problem encountered with cooling elements of the aforedescribed kind is one of creating conditions which enable a very small, positively guided air stream to guide the heated air flow into the cooling element through the agency of an ejector effect, so that the heated air flow is cooled to a greater extent than is otherwise normal when solely natural convection conditions prevail.

Solution

Thus, the present invention relates to an arrangement for use in a unit which is adapted to provide a heat-exchange function and which incorporates heat-emitting and heat-absorbing means exposable to an incoming medium flow entering the unit, such as to impart to the medium flow a changed energy content in the form of a medium flow leaving the unit.

In accordance with the invention a further flow of medium is delivered under pressure to the incoming medium flow in the region of the unit, or at least in the immediate vicinity of said region, this further flow of medium being so directed as to force the incoming medium flow through the unit by means of a co-ejector effect, and particularly to change the direction of the incoming medium flow through the unit, so as to extend the stay-time of said flow in said unit.

In accordance with the invention the unit comprises a plurality of mutually adjacent pipes which extend through a plurality of cooling fins, the further flow of medium being generated through holes formed in two or more of these pipes.

In accordance with one embodiment of the invention, one and the same pipe is provided with a plurality of holes, each of which is located between cooling fins. Preferably, one or more of said holes is (are) located between mutually adjacent cooling fins.

When one or more holes is (are) located between mutually adjacent fins, that section of the pipe located within one or more defining fins is preferably imperforate.

In accordance with one preferred embodiment of the invention the further medium flow is directed from a first edge part of the unit, substantially transversely of the incoming medium flow, although with a directional component conforming to the direction of the incoming flow, the incoming medium flow being deflected to pass in a direction along the fins instead of passing across the same.

An advantage is afforded when the incoming medium flow is mixed with the further medium flow. Consequently, in accordance with the invention deflecting means are arranged adjacent said edge part of the unit, therewith to impart to the exiting medium flow a direction which conforms substantially with the direction of the incoming medium flow.

To this end, the deflecting means is preferably located at the edge part located opposite the first edge part from which the further medium flow departs.

Although the deflected means is preferably located solely adjacent one edge part of the unit, it is possible, in accordance with the invention, to arrange for a plurality of further medium flows to depart from opposing edge parts and to be directed along the cooling fins, by providing suitable deflecting means on both sides of the unit.

It is also possible within the scope of the invention to permit the further medium flows to be directed essentially in a direction conforming with the direction of the incoming medium flow and the medium flow exiting from said unit.

The invention is particularly suited for application in cases where the medium flows comprise a gas and/or a gas mixture, in the latter case preferably air. It is proposed herewith that a further air flow, or the aforesaid further air flows, are supplied between the fins via a system of pipes having a pipe-pressure beneath 50,000 Pa. In this case it is proposed that the further air flow or the aforesaid further air flows are supplied through a pipe perforated with holes having a cross-sectional area beneath 200 mm². Preferably the hole diameter is between 0.5 and 5 mm, when the holes are of circular cross-section.

The further air flow or air flows are so selected that the sum of the mass weight per unit of time of respective flows multiplied by their velocity has a value smaller than 300 and greater than 0.1, preferably a value lying within the range of 5–30 calculated per square meter of cross-sectional area at right angles to the direction of the air flow.

The arrangement according to the invention is particularly suitable for use in a cooling element or cooling unit which is intended for cooling an array of electronic equipment and which forms part of an air-circulation cooling system, in which the cooling element is positioned above the array of equipment so that, for example, an air flow cooled by the cooling element is able to sink down onto or around the array of equipment, preferably between two arrays, while an air flow heated by the components of the said equipment in operation is able to rise upwards towards the element.

When the arrangement according to the invention is incorporated in a system of this kind, a further air flow is delivered to the heated air flow in the region of the cooling element, this further air flow being so directed as to force the heated air flow through the cooling element with the aid of a co-ejector effect, the heated air flow entering the cooling element, e.g., from above or from the side, while the medium flow exiting from the unit can be directed downwardly and preferably along the side of the electronic equipment.

In those cases in which two arrays of electronic equipment are spaced from one another and the cooling element is located between said arrays, it is proposed in accordance with the invention that at least two further air flows are generated in one and the same cooling element, so that the air flow cooled by said cooling element is divided in a controlled fashion into part-flows, each of which is directed along a respective array of equipment. In this case, each of the further air flows is generated between two, mutually different cooling fins in the cooling element.

In accordance with another embodiment of the invention, the further air flow is caused to mix with the heated air flow in the cooling element so as to form a cooled air flow, which is caused to pass through the unit at a velocity below 50 m/sec, preferably between 2 and 5 m/sec.

In addition, the further air flow shall be so arranged as to deflect the heated air flow in order to obtain a longer path of travel along the fins than that obtained in the absence of a further air flow, which means that the heated air flow will normally be directed transversely of the longitudinal extension of the fins. The proportion of the further air flow in the cooled air flow shall be less than 25%, preferably less than 10%.

Advantages

The advantages primarily characteristic of an arrangement according to the present invention reside in the provision of conditions which enable the incoming medium flow to be forced, with the aid of an ejector effect, through a unit having a heat-exchange function, without requiring the provision of means herefor externally of the unit and/or in its immediate vicinity, while increasing the ability of the unit to emit or absorb heat.

The primary characterizing features of an arrangement according to the present invention are set forth in the characterizing clause of the following claim 1.

BRIEF DESCRIPTION OF THE DRAWINGS

A preferred embodiment of the invention will now be described in more detail with reference to the accompanying drawings, in which.

DESCRIPTION OF A PREFERRED EMBODIMENT

Figure 1:
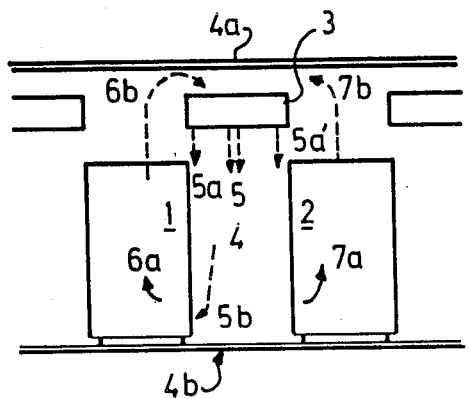
FIG. 1 is a greatly simplified front view of a known cooling system used in conjunction with telephone equipment.

FIG. 1 illustrates schematically and in side view electronic telephone equipment provided with a cooling system for cooling an array of electronic devices which incorporate electronic components and the like. The electronic equipment mounted on printed circuit cards, is placed in frames or racks arranged in rows, designated 1 and 2. Defined between mutually adjacent rows of frames or racks, such as rows 1 and 2, is a passageway 4 (for service personnel and like attendants). A cooling element 3 is mounted directly above a respective passageway, adjacent a sealing structure referenced 4a. The floor structure supporting the racks is referenced 4b.

The cooling element 3 forms part of a cooling system intended for cooling one or more arrays of equipment 2, by air circulation or gravitational convection, in which system the cooling element is either located above a single row of racks or between two mutually adjacent rows of racks, as in the case of the preferred embodiment.

It will be understood that the cooling element can be located immediately above the rack 1, with the direction in which medium passes through the element 3 being opposite to that illustrated, the cooled air flow dividing at a location adjacent the ceiling 4a and being permitted to sink down into the respective passageway on either side of the row of racks 1.

The following description is made with reference to the alternative embodiment illustrated in FIG. 1.

In this way conditions are created for enabling an air flow 5, 5a, 5a', cooled by the cooling element 3, to sink down towards a respective array, or preferably towards the floor 4b of the passageway 4 between two arrays 1 and 2. A respective air stream 6a, 6b, and 7a, 7b heated by an array 1 and 2 in operation is now able to rise up through said array and over the electronic components incorporated therein, therewith entraining cooling air through the array of electronic equipment and towards the cooling element.

The invention is based on the concept that the cooling effect afforded by the cooling element 3 on the heated air flow can be improved by arranging for said air flow to be delivered to the cooling element 3 in the form of a forced air stream, with the aid of an ejector effect, although with a longer, or extended, stay-time in the cooling element and/or a longer travel path with respect to the passage of the air flow through the cooling element 3.

Figure 2:
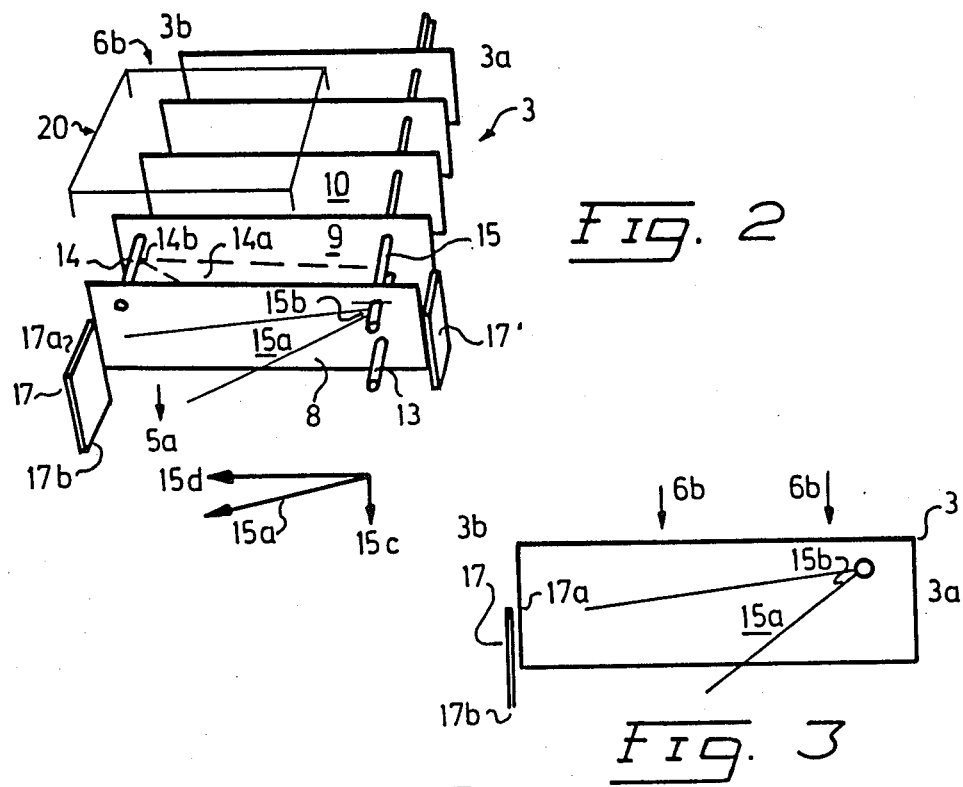
FIG. 2 is a simplified perspective view of a cooling element according to the present invention for use with the system illustrated in FIG. 1.

Since the present invention relates to an arrangement for use in conjunction with the cooling element 3, a cooling element constructed in accordance with the invention is illustrated in perspective in FIG. 2, in a somewhat simplified form.

The cooling element illustrated in FIG. 2 comprises, in a known manner, a plurality of mutually adjacent fins 8, 9, 10. The fins may present corrugated surfaces, or may be in a form different from that illustrated. Each fin is provided with a number of holes for accommodating a system of coolant pipes. The pipes included in the pipe system are normally placed closer together than illustrated in FIG. 2, and for the sake of simplicity it is assumed that coolant flows solely through pipe 13. The fins 8, 9 and 10 are cooled by this coolant pipe.

Further pipes 14 and 15 also pass through the fins 8, 9 and 10, these further pipes being normally intended for conveying coolant and for cooling the fins. However, in accordance with the invention, these further pipes are perforated and supplied with air under pressure.

Thus, FIG. 2 illustrates an arrangement in a heat-exchange assembly, in which heat-emitting or heat-absorbing means 8, 9, 10, 13 incorporated in the cooling element 3 can be exposed to a flow of medium 6b entering the cooling element, said means being effective to change the energy content of the medium flow, such as to produce colder air flows 5, 5a and 5a', which exit from the cooling element.

As will be seen from FIG. 2, a further flow of medium 15a is delivered to the aforesaid incoming medium flow, in the region of the cooling element 3.

This further air flow 15a is so directed as to force the incoming medium flow 6b through the cooling element, with the aid of an ejector effect.

As beforementioned, the cooling element 3 comprises a plurality of mutually adjacent coolant pipes, of which only the pipe 13 is shown, the coolant pipe, or pipes, extending through a plurality of fins, these fins also being provided in greater numbers than those illustrated, and the further air flow being generated through holes provided in one or more of said pipes.

In FIG. 2 one such further air flow is designated 15a, and another is designated 14a.

One and the same pipe, e.g. the pipe 14, may be provided with a plurality of holes, each located between two fins 8 and 9. For the sake of clarity only one hole, 14b, is shown in FIG. 2.

It lies within the scope of the invention to locate one or more holes between mutually adjacent fins, such as the hole 14 between the fins 8 and 9. However, when one or more holes is (are) located between mutually adjacent fins 8 and 9, it also lies within the concept of the invention to leave the pipe free of holes, i.e. imperforate, in the region defined by certain mutually adjacent fins, i.e. between the fins 9 and 10, or by a group of fins, with the exception of those regions in which an air flow similar to the air flow 15a is to be generated.

It also lies within the purview of the invention to locate one or more holes between mutually adjacent fins and to leave imperforate a section of the pipe between selected mutually adjacent fins, or a sequential arrangement of fins extending from the perforated region of the pipe.

Counter-directional medium flows for the various fins are used to split the exiting flow of cooled air into two part-flows 5a and 5a', each part-flow being directed along a respective row of racks. When the further flows of medium are permitted to act uniformly within the area confined by the same fins, there is generated a central air flow 5.

The effect and direction of the air flows can be varied, by varying the pressure in the pipe 15 in relation to the pressure in the pipe 14.

It is also possible, in accordance with the invention, to readily adapt the cooling potential of the cooling system to the prevailing load and to variations in said load, simply by varying the pipe pressure.

Figure 3:
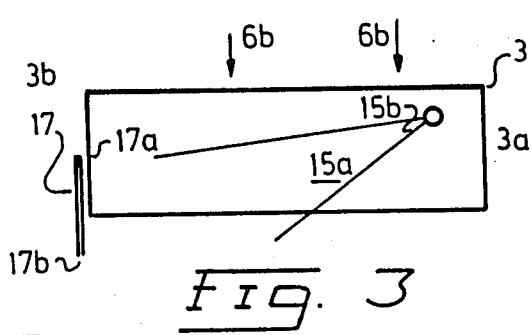
FIG. 3 is a plan view of a cooling fin incorporated in a unit according to FIG. 2.

As will be seen from FIG. 3, the further medium flow, or air flow 15a, is directed from one edge part 3a of the cooling unit 3, substantially transversely to the incoming flow of medium 6b, although with a directional component conforming to the direction 6b of the incoming medium flow.

This directional component is designated 15c in FIG. 2. The directional component extending transversely to the medium flow 6b is designated 15d.

It will therefore be apparent that the incoming medium flow 6b will be deflected to the left in FIG. 3 by the further air flow 15a, therewith to mix with the further medium flow 15a. A means 17 for deflecting the mixed flow of media is arranged adjacent the opposing edge part 3b of the cooling element 3, said means 17 being located in that edge part 3b which lies opposite the edge part 3a from which the further medium flow 15a exits.

According to one embodiment of the invention the deflecting means 17 is arranged solely adjacent one edge part and between respective fins. Alternatively, deflecting means 17 may be located externally of all of said fins on each side of one and the same fin. It will be seen from FIG. 2 that further medium flows are arranged to depart from opposing edge parts, such that the medium flow 15a departs from the edge part 3a and the medium flow 14i a from the edge part 3b, both said medium flows being directed along the fins.

When a plurality of pipes 14, 15 are orientated in one and the same horizontal plane, it may be suitable to allow the further medium flow, or further medium flows, to pass substantially in a direction corresponding to the direction of the incoming medium flow 6b.

It is assumed here that the medium flow of the illustrated embodiment is a gas flow and/or a flow of gaseous mixture, preferably air, and that the further medium flow 15a, or further medium flows 14a, 15a, is (or are) delivered to the cooling element 3 through a system of pipes 14, 15 having a pipe-pressure below 50,000 Pa, preferably between 50 and 5,000 Pa.

Practical tests have indicated that the pipe pressures should lie between 2,000 and 5,000 Pa.

The further medium flow, or medium flows 14, 15a, is (are) delivered through a pipe 14, 15 provided with holes 14b, 15b having an area smaller than 200 mm$^2$. The holes are preferably circular in cross-section and have a diameter ranging from 0.1 to 10 mm, preferably from 0.5 to 5 mm.

The velocity of the medium flow adjacent respective holes shall be below the speed of sound.

When there is introduced a definition which establishes the mass weight of the medium flow per unit of time multiplied by its velocity for a given surface area (calculated per square meter of cross-sectional area at right angles to the direction of the air flow), referenced 20 in FIG. 2, the further medium flow, delivered to said surface area shall be so selected that the sum of the mass weight of respective medium flows per unit of time multiplied by their velocity, applicable to the nozzle-like holes 14b and 15b, has a value beneath 300 and above 0.1, preferably a value lying within the range of 5–30 kgm/s$^2$.

Figure 4:
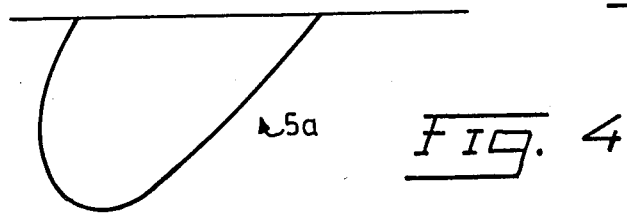
FIG. 4 illustrates the velocity profile of a medium flow exiting from the unit when utilizing a further air flow.

Finally, FIG. 4 shows a velocity profile of the medium flow 5a departing from the cooling element, from which it can be seen that propagation of the medium flow is somewhat greater at the edge part 3b of the cooling element than at its edge part 3a. This fact is preferably utilized by placing the edge part 3b in the immediate proximity of the equipment 1, in the manner illustrated in FIG. 1, which means that the flow of air exiting from the cooling element will creep along the surface towards the passageway 4 adjacent the equipment 1, therewith forming the medium flow 5b.

Because the air jet or air flow 14a issuing through the nozzle-like hole 14b is directed between the fins 8 and 9 in an opposite direction it will produce a velocity profile which is the mirror image of that shown in FIG. 4. The jet of medium 14a will impart to the medium flow 5a a high velocity in the vicinity of the equipment 2.

When a cooling element constructed in accordance with FIG. 2 is used as a cooling element 3 in the arrangement of FIG. 1, it will be seen that each of the further air flows is so directed as to direct the respective air flows 5a and 5b' cooled by the cooling element along the arrays of equipment. In addition, when a single cooling element is located between two mutually adjacent rows of equipment, at least two further air flows can be created such that each of the air flows 5a, 5' cooled by the cooling element is directed along its respective row of equipment 1, 2. Each of the further air flows is generated between two fins on the cooling element. Alternatively, each air flow can be placed within a region defined by a plurality of mutually adjacent fins.

In accordance with one embodiment of the invention, the further air flow 14a shall mix with the heated air flow 6b adjacent the cooling element and form a cooled air flow 5a' having a velocity beneath 15 m/sec. The further air flow 14a also deflects the flow of heated air 6b in this case, so that the path travelled by the air flow 6b along the fins is longer than would otherwise be the case in the absence of such a further air flow. Moreover the proportion of air from the further air flow 14b in the cooled air flow 5a' shall be less than 15%.

The deflecting means 17 may have the form of a plate, which is preferably attached to one or more fins and which extends from the central region of respective fins, down beyond the lowermost edge thereof.

An advantage can be gained by placing the top edge 17a of the deflecting means 17 on a level with the uppermost extension of the flow lobe. Similarly, the bottom edge 17b of the deflecting means 17 may be placed on the level of the lowermost extension of the flow lobe. The edge, however, is preferably shorter than this, as illustrated in FIG. 3.

The deflecting means 17 may extend along all of the fins, or may be constructed to cover solely the interspace between those fins located in regions where holes 15b are provided.

The deflecting means may also have the form of a plate which stands free from the fins and which is mounted for vertical movement on support means, not shown.

The above description of the deflecting means 17 also applies to the means 17'.

When the deflecting means 17 is positioned in the manner illustrated in FIG. 3 there is a velocity profile 5a' according to FIG. 4.

This shows clearly the direction of the outgoing stream 5a, towards and along the row of equipment 1.

It will be appreciated that a change in pressure in the pipe 15 will result in a change in the velocity profile, which affords the possibility of regulating the ejector effect and the forcing velocities of incoming flows of medium, e.g. in dependance on prevailing loads.

It will be understood that the invention is not restricted to the described and illustrated embodiment, and that modifications can be made within the concept of the invention as defined in the following claims.

We claim:

1. An arrangement in a unit having a heat-exchange function and incorporating heat-emitting or heat-absorbing means which are capable of being exposed to a flow of incoming medium entering the unit and which are effective to change the energy content of said incoming medium flow to form a second medium flow which exits from the unit, comprising:
   a plurality of fins forming parallel channels;
   means for delivering to the incoming flow of medium in the region of said unit, a further flow of medium having a mass weight per unit of time multiplied by the velocity of the further flow equal to a value between 0.1 and 300 kg-m/s$^2$ calculated per square meter of cross-sectional area perpendicular to the direction of the second medium flow;
   a first of the flow delivering means extending through said fins so as to deliver a portion of the further medium of flow from one edge of the unit substantially toward the opposite edge of the unit in one of said channels;
   a second of the flow delivering means extending through said fins so as to deliver another portion of the further medium of flow from the opposite edge of the unit substantially toward the one edge of the units and in a second of said channels;
   said flow delivering means directing the further flow of medium at substantially a right angle to the incoming medium flow and with a directional component in the direction of the incoming medium flow; and
   said further medium flow is so directed as to force the incoming medium flow through the unit with the aid of an ejector effect.

2. An arrangement according to claim 1, wherein the unit comprises a plurality of mutually adjacent pipes that extend through a plurality of fins; and the further medium flow is generated through holes formed in more than one of said pipes.

3. An arrangement according to claim 1, wherein one and the same pipe is provided with a plurality of holes, each of which is located between two mutually adjacent fins.

4. An arrangement according to claim 3, wherein two holes are located between mutually adjacent fins.

5. An arrangement according to claim 3, wherein one of said holes is located between mutually adjacent first fins, and an imperforate pipe section is located between adjacent second fins.

6. An arrangement according to claim 1, wherein the further medium of flow is directed from the edge surfaces of the unit substantially at right angles to the incoming medium flow, although with a directional component corresonding to the direction of the incoming medium flow.

7. An arrangement according to claim 1, wherein the unit includes medium flow deflecting means.

8. An arrangement according to claim 7, wherein the deflecting means is located at that edge part of the unit which is opposite the edge part from which the further medium flow departs.

9. An arrangement according to claim 1, further comprising means for emitting a plurality of further medium flows from opposing edge parts of the unit.

10. An arrangement according to claim 1, wherein the further medium is directed substantially in a direction which conforms to the direction of the incoming flow of medium.

11. An arrangement according to claim 1, in which the medium comprising said flows is a gas, wherein the further air flow is delivered to the unit through a pipe system having a pipe pressure beneath 50,000 Pa.

12. An arrangement according to claim 11, wherein the further air flow is conducted through perforated pipes, the perforations of which each have a cross-sectional area smaller than 200 mm$^2$.

13. An arrangement according to claim 12, wherein the perforations are holes of substantially circular cross-section and have a diameter of from 0.5 to 5 mm.

14. An arrangement according to claim 4, wherein one of said holes is located between mutually adjacent first fins, and an imperforate pipe section is located between adjacent second fins.

15. An arrangement according to claim 2, wherein the unit includes medium flow deflecting means.

16. An arrangement according to claim 3, wherein the unit includes medium flow deflecting means.

17. An arrangement according to claim 12, wherein the perforations are holes of substantially circular cross-section and have a diameter of from 0.5 to 5 mm.

18. An arrangement according to claim 11, wherein the pipe pressure is between 50 and 500 Pa.

19. In a cooling system for cooling an array of electronic equipment with circulating air, a cooling element placed above said array so that an air flow cooled by the cooling element sinks down towards the array while an air flow heated by the array is delivered to the cooling element, said cooling element including a unit having a heat-exchange function and incorporating heat-absorbing means which are capable of being exposed to a flow of incoming medium entering the unit and which are effective to change the energy content of said incoming medium flow to form a second medium flow which exits from the unit, comprising means for delivering a further flow of medium to the incoming flow of medium in the region of said unit and for directing the further flow of medium at substantially a right angle to the incoming medium flow and with a directional component in the direction of the incoming medium flow; and said further medium flow is so directed as to force the incoming medium flow through the unit with the aid of an ejector effect.

20. An arrangement according to claim 19, wherein the further air flow is so directed that the air flow cooled by the cooling element is directed along the array of equipment.

21. An arrangement according to claim 19, wherein at least two further air flows are generated in one and the same cooling element such that the air flows cooled by the cooling element are directed along a respective array of equipment.

22. An arrangement according to claim 21, wherein each of the further air flows is located between two fins incorporated in the cooling element.

23. An arrangement according to claim 19, wherein the further air flow mixes with the heated air flow in the cooling element and forms a cooled air flow having a velocity through the element of less than 15 m/sec.

24. An arrangement according to claim 19, wherein the further air flow deflects the heated air flow to obtain a longer travel path along the fins than that obtained in the absence of a further air flow.

25. An arrangement according to claim 23, wherein the proportion of air from the further air flow in the cooled air flow is less than 25%.

26. An arrangement according to claim 20, wherein at least two further air flows are generated in one and the same cooling element such that the air flows cooled by the cooling element are directed along a respective array of equipment.

27. An arrangement according to claim 23, wherein the velocity is between 2 and 5 m/sec.

28. An arrangement according to claim 25, wherein the proportion is less than 10%.

29. An arrangement in a unit having a heat exchange function and incorporating heat-emitting or heat-absorbing means which are capable of being exposed to a flow of incoming medium entering the unit and which are effective to change the energy content of said incoming medium flow to form a second medium flow which exits from the unit, comprising:

means extending through said unit for delivering to the incoming flow of medium a further flow of medium and for directing the further flow of medium at substantially a right angle to the incoming medium flow and with a directional component in the direction of the incoming medium flow; and means for deflecting the medium flows being located at an edge of the unit that is opposite an edge from which the further medium flow issues;

wherein said further medium flow is so directed as to force the incoming medium flow through the unit with the aid of an ejector effect.

30. An arrangement according to claim 29, wherein flow deflecting means are arranged adjacent solely one edge part of the unit.

31. An arrangement according to claim 29, wherein the delivery means is a pipe extending through the fins.

* * * * *